United States Patent [19]

Freitag et al.

[11] 3,878,555

[45] Apr. 15, 1975

[54] SEMICONDUCTOR DEVICE MOUNTED ON AN EPOXY SUBSTRATE

[75] Inventors: Theodor Freitag; Hanns-Heinz Peltz; Hubert Pretsch; Detlev Schmitter, all of Munich, Germany

[73] Assignee: Siemens Aktiengesellschaft, Berlin, Germany

[22] Filed: July 18, 1973

[21] Appl. No.: 380,161

Related U.S. Application Data

[63] Continuation of Ser. No. 142,831, May 11, 1971, abandoned.

[30] Foreign Application Priority Data

May 14, 1970 Germany............................ 2023680

[52] U.S. Cl. ....................... 357/71; 29/589; 357/67; 357/68; 357/80

[51] Int. Cl. ............................ H01l 3/00; H01l 5/00

[58] Field of Search ............. 317/234, 3, 4, 5.2, 5.3, 317/5.4; 29/589

[56] References Cited

UNITED STATES PATENTS

| | | | |
|---|---|---|---|
| 3,292,240 | 12/1966 | McNutt et al. | 317/234 L |
| 3,544,857 | 12/1970 | Byrne et al. | 317/234 G |
| 3,555,664 | 1/1971 | Bingham et al. | 317/234 N |
| 3,561,107 | 2/1971 | Best et al. | 317/234 G |
| 3,564,109 | 2/1971 | Ruechardt | 317/234 E |
| 3,773,628 | 11/1973 | Misawa et al. | 317/234 N |

*Primary Examiner*—Andrew J. James
*Attorney, Agent, or Firm*—Herbert L. Lerner

[57] ABSTRACT

We contact semiconductor bodies with intermediate substrates, which are themselves connected with the system carrier. The intermediate substrates consist of lined synthetic plates and afford an increased contact security and reliability of the finished components. The invention is particularly suitable for producing components with reliable contacts.

1 Claim, 2 Drawing Figures

SEMICONDUCTOR DEVICE MOUNTED ON AN EPOXY SUBSTRATE

Figure 1:
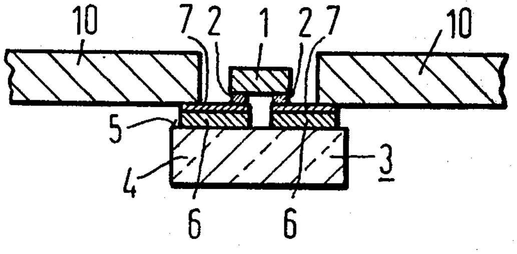

This is a continuation of application Ser. No. 142,831, filed May 11, 1971 now abandoned.

The invention relates to a device for contacting semiconductor components with a carrier whereby the semiconductor components in a semiconductor body are provided with contact spots.

It is known to paste semiconductor systems with a system carrier or to alloy it upon the same. Contacting with wires is used to produce the electrical connections between the contact spots of the semiconductor body and the carrier. Rejects occur in these devices since the indicated wire connections are hard to contact. Also, the known method is unsuitable for an automatic performance.

The object of the present invention is to produce a reliable connection of components or of circuits, with a carrier. The method for producing this connection should be as simple as possible. Its performance preferably should also be carried out automatically.

To achieve this objective, we provide that at least two contact spots of the semiconductor body are connected in electrical conductivity with the carrier, via the partially metallized surface of an intermediate substrate of electrically insulated synthetic.

Our arrangement has the advantage of offering, in addition to an increased contact reliability of the finished components, a reduction in production costs, since they can be produced automatically, as will be described hereinbelow.

Another feature of the invention is that the intermediate substrate be lined with a copper film and that the copper film be soldered, via a tin film, with the carrier and with the contact spots, so that the desired electrical connections between the contact spots and the carrier are maintained.

The copper film guarantees a good electrical connection between the contact spots and the carrier. The tin film serves for soldering the contact spots and the carrier with the copper film.

Suitable materials for the intermediate substrate are epoxy resin hard paper, or polyimide foil. They have the required mechanical stability, are easy to process as well as being inexpensive.

It is recommended that the copper film be about 5 to 20 $\mu$ thick, particularly 17$\mu$ thick and the tin film be about 6$\mu$ while the intermediate substrate is about 0.01 to 0.5 mm thick. These thicknesses provide, firstly, a reliable connection between the semiconductor body and the carrier and, secondly, the smallest possible construction of the entire arrangement.

It is preferable that the contact spots be raised with respect to the remaining surface of the semiconductor body. As a result, the semiconductor material is not electrically short circuited during the contacting of the semiconductor body with the tin film of the intermediate substrate.

Finally, a preferred method of producing the arrangement according to the invention, is to spatially place the semiconductor body with the aid of heatable suction tweezers, over a substrate plate, lined with copper film and tin film thereon. Thereafter, the semiconductor is seated on the substrate. The contact spots of the semiconductor body are soldered with the tin film, by heating the suction tweezers. Following the contacting of the provided semiconductor body with the substrate plate, the latter is separated into individual intermediate substrates, whereby each semiconductor body is soldered with at least one intermediate substrate. Finally, the individually intermediate substrates are soldered with the metallic carrier, so that the desired electrical connections between the contact spots result via the lined surface of the intermediate substrate to the carrier.

Other features and details of the invention are derived from the following description of an embodiment with reference to the drawing, wherein:

FIG. 1 shows, in section, a device produced according to the invention; and

Figure 2:
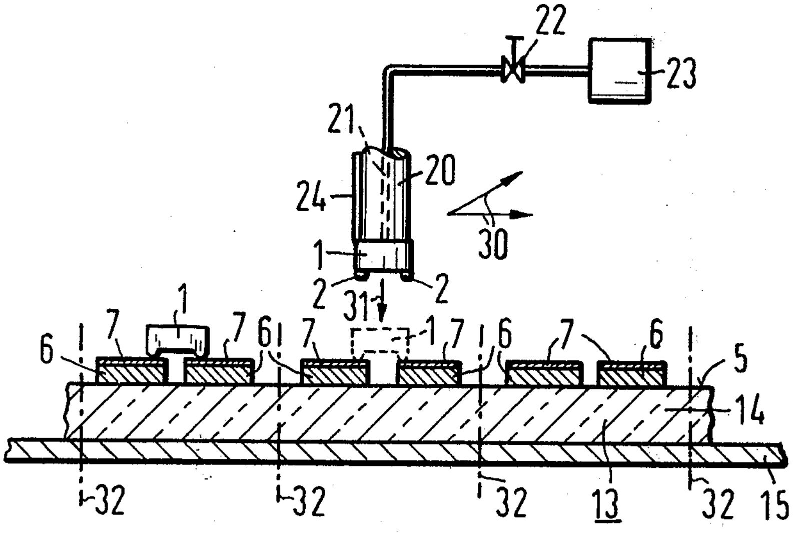

FIG. 2 schematically illustrates the process of producing the device of FIG. 1.

Similar parts are provided with the same numerals in both figures.

FIG. 1 shows a semiconductor body 1 with raised contact spots 2. An intermediate substrate 3 consists of a 0.5 mm thick epoxy resin hard paper plate 4. The surface 5 of the epoxy resin hard paper plate 4 is lined with a 17$\mu$ thick copper film 6 on which is an about 6$\mu$ thick tin film 7. The semiconductor body 1 is soldered, via contact spots 2, with two electrically separated parts of the tin films 7. Each of these separated parts of the tin film 7 is soldered with the metallic carriers 10, so that electrical connections are maintained between the contact spots 2 and the carriers 10.

As shown in FIG. 2, a substrate plate 13 lies initially upon a work table 15. The substrate plate 13 consists of an epoxy resin hard paper plate 14, lined with copper 6 and tin 7 films. A semiconductor body 1 is picked up by suction tweezer 20 and placed into the position illustrated in FIG. 2. The suction tweezer is movable in a plane, parallel to the surface 5. This was indicated in FIG. 2 by arrows 30. The suction tweezer 20 has a duct 21, shown in dotted lines. This duct 21 is connected through a valve 22, with a vacuum pump 23. Furthermore, the suction tweezer 20 is provided with a heating device 24, which may be heated by pulses. After placing the semiconductor body 1, the suction tweezer 20 is lowered, so that the contact spots 2 of the semiconductor body 1 come into contact with the provided tin films 7. This step is shown in FIG. 2 by the arrow 31 and by the dotted position of the semiconductor body 1.

The suction tweezer 20 is then heated for a short time by heating device 24, so that the contact spots 2 of the semiconductor body 1 are soft-soldered with the tin films 7. Valve 22 is closed and suction tweezer 20 is moved upward.

After connecting all the semiconductor bodies with the individual films of the lined substrate plate 13, which is approximately 200 cm$^2$ in order to accommodate 800 semiconductor bodies, the substrate plate 13 is divided with the aid of hammer shears, along the dot-dash lines 32, into individual intermediate substrates 3.

The individual intermediate substrates 3 are then soldered with the carriers 10 to produce the device illustrated in FIG. 1. This device is thereafter mounted into a housing.

We claim:

1. A contact device for joining semiconductor components with a carrier means upon the application of heat comprising a semiconductor body provided with at least two contact spots raised with respect to the remaining surface of the semiconductor body, connecting means for connecting said semiconductor body in electrical circuit relation with said carrier, a substrate of epoxy resin hard paper 0.01 to 0.5 mm. in thickness intermediate said semiconductor body and said carrier, the substrate being lined with a copper film varying from 5 to 20 $\mu$ in thickness and having a tin film about 6 $\mu$ thick disposed thereon, said tin film joining said carrier and said contact spots to thereby connect said contact spots and said carrier in electrical circuit relationship with respect to one another, the substrate being adapted to join said body and carrier in electrical circuit relation with respect to one another via said contact spots.

* * * * *